United States Patent [19]

Oto

[11] Patent Number: 5,437,051
[45] Date of Patent: Jul. 25, 1995

[54] BROADBAND TUNING CIRCUIT FOR RECEIVING MULTI-CHANNEL SIGNALS OVER A BROAD FREQUENCY RANGE

[75] Inventor: Hideki Oto, Fukaya, Japan
[73] Assignee: Kabushiki Kaisha Toshiba, Kawasaki, Japan
[21] Appl. No.: 946,630
[22] Filed: Sep. 18, 1992

[30] Foreign Application Priority Data

Sep. 19, 1991 [JP] Japan ............... 3-239775

[51] Int. Cl.$^6$ ............................ H04B 17/02
[52] U.S. Cl. .................... 455/3.2; 455/143; 455/189.1; 455/318; 348/731
[58] Field of Search ............ 455/3.2, 142, 143, 144, 455/188.1, 188.2, 189.1, 191.3, 313, 314, 323, 180.1, 180.2, 190.1, 318; 348/731

[56] References Cited

U.S. PATENT DOCUMENTS

| | | | |
|---|---|---|---|
| 3,581,209 | 5/1971 | Zimmerman et al. | 455/313 |
| 3,931,578 | 1/1976 | Gittinger | 455/190.1 |
| 4,009,441 | 2/1977 | Kumagai et al. | 455/190.1 |
| 4,132,952 | 1/1979 | Hongu et al. | 455/180.1 |
| 4,419,768 | 12/1983 | Yamashita et al. | 455/180.1 |
| 4,592,093 | 5/1986 | Ouchi et al. | 455/3.2 |
| 4,598,425 | 7/1986 | Skerlos et al. | 455/180.1 |
| 5,010,400 | 4/1991 | Oto | 348/11 |

FOREIGN PATENT DOCUMENTS

| | | | |
|---|---|---|---|
| 0026731 | 2/1980 | Japan | 455/190.1 |
| 0029129 | 1/1989 | Japan | 455/3.2 |
| 0058521 | 3/1991 | Japan | 455/3.2 |

Primary Examiner—Reinhard J. Eisenzopf
Assistant Examiner—Andrew Faile
Attorney, Agent, or Firm—Cushman Darby & Cushman

[57] ABSTRACT

A broadband tuning circuit adapted for receiving both BS and CS broadcasting signals. The circuit includes an input circuit for receiving RF signals which associated with the BS and CS broadcasting signals, respectively, a splitter for splitting the RF signal to a low RF signal and a high RF signal, an oscillator for generating a local frequency signal, a first mixer for frequency converting the low RF signal to a first IF signal in the up-heterodyne fashion using the local frequency signal, a second mixer for frequency converting the high RF signal to a second IF signal in the down-heterodyne fashion using the local frequency signal, a selector for selecting either the first or the second IF signal and a demodulator for demodulating the information from the selected IF signal.

4 Claims, 4 Drawing Sheets

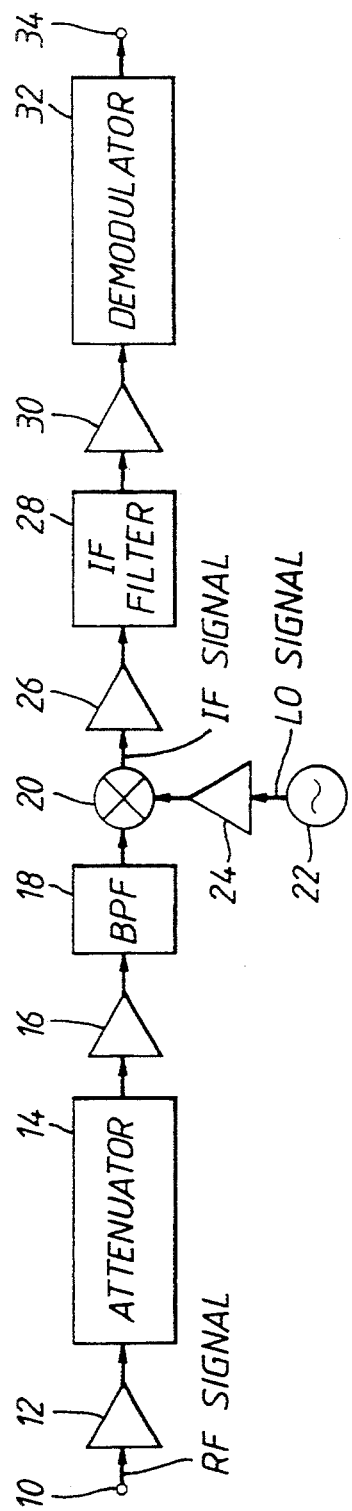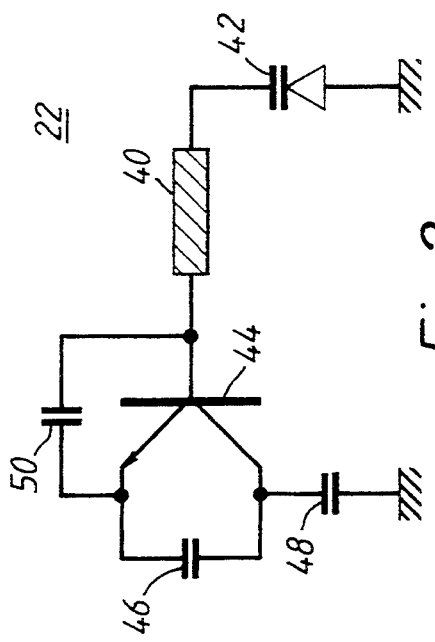

BROADBAND TUNING CIRCUIT FOR RECEIVING MULTI-CHANNEL SIGNALS OVER A BROAD FREQUENCY RANGE

FIELD OF THE INVENTION

The present invention relates generally to a broadband tuning circuit, and more particularly, to a broadband tuning circuit suitable for receiving multi-channel signals which spread over a very broad frequency band.

BACKGROUND OF THE INVENTION

Recently, several new broadcasting media or sources have been into services, or on planning for services at a near future. For example, a so-called Broadcast Satellite broadcasting (referred to as BS broadcasting, hereinafter) has been serviced for several years. While a so-called Communication Satellite broadcasting (referred to as CS broadcasting, hereinafter) has recently laied for service. In addition, a so-called CATV system has been in services for long years. These new broadcasting media generally service their broadcasting signals at different frequency bands with each other.

Referring now to FIGS. 1 and 2, a conventional tuning circuit for receiving such a BS broadcasting signal will be briefly described. FIG. 1 is a block diagram showing the conventional tuning circuit. FIG. 2 shows a typical example of the voltage controlled oscillator (referred to as VCO, hereinafter) comprised in the tuning circuit.

In FIG. 1, an input terminal 10 is provided for receiving a prescribed RF signal. The RF signal is converted from a BS broadcasting signal which is received by an antennna system (not shown), so that the BS broadcasting signal is converted to the prescribed RF signal by a converter in the antennna system. The RF signal on the input terminal 10 is then applied to a first RF amplifier 12 and wherein the RF signal is amplified to a suitable level. The RF signal amplified in the first RF amplifier 12 is then applied to an attenuator 14 so that the RF signal is attenuated for reducing noise components. The RF signal attenuated in the attenuator 14 is then applied into a second RF amplifier 16 wherein the RF signal is again amplified to restore the level of the RF signal. The RF signal amplified in the second RF amplifier 16 is then applied to a band pass filter (referred to as BPF, hereinafter) 18. The BPF 18 passes therethrough a prescribed frequency band of the RF signal for removing undesired frequency components out of the frequency band. The RF signal passing through the BPF 18 is then applied to a mixer 20. The mixer 20 receives a local oscillation signal (referred to as LO signal, hereinafter), other than the RF signal. The LO signal is generated by a VCO 22, and then applied to the mixer 20 through a buffer amplifier 24. In the mixer 20, the RF signal is frequency converted to an intermediate frequency signal (referred to as IF signal, hereinafter) in the up-heterodyne fashion using the LO signal.

The IF signal output from the mixer 20 is applied to a first IF amplifier 26 wherein the IF signal is amplified to a suitable level. The IF signal amplified in the first IF amplifier 26 is then applied to an IF filter 28. The IF filter 28 passes therethrough a prescribed frequency band of the IF signal for removing undesired frequency components out of the IF frequency band. The IF signal passing through the IF filter 28 is then applied to a second IF amplifier 30 wherein the IF signal is again amplified to another suitable level. The IF signal amplified in the second IF amplifier 30 is then applied to a demodulator 32. The demodulator 32 demodulates a baseband signal from the IF signal, so that the baseband signal is output from the tuning circuit through an output terminal 34.

In such an arrangement of the conventional tuning circuit, the RF signal applied to one input of the mixer 20 has a frequency band of about 1035 MHz through 1332 MHz, while the mixer 20 is provided to output the IF signal with a prescribed frequency of 402.78 MHz. Thus, the LO signal applied to the other input of the mixer 20 from the VCO 22 is varied its frequency in the range of about 1478 MHz through 1735 MHz.

One example of the VCO 22 is illustrated in FIG. 2. As shown in FIG. 2, a series circuit of an inductor 40 and a variable capacitor 42 is coupled between the base of a transistor 44 and a reference potential source, e.g., a ground circuit. The transistor 44 is coupled to three capacitors 46, 48 and 50. The capacitor 46 is coupled across the collector and the emitter of the transistor 44. The capacitor 48 is coupled between the collector of the transistor 44 and the reference potential source. The capacitor 50 is coupled across the emitter and the base of the transistor 44. In this arrangement of the VCO 22, the oscillation frequency of the VCO 22, i.e, the LO signal is changed by varying the capacitance of the variable capacitor 42.

The frequency F of the LO signal obtained by the VCO 22 is given by the following Equation (1).

$$F = a \cdot (L \cdot C)^{-\frac{1}{2}} \qquad (1)$$

wherein L and C represent the inductance of the inductor 40 and the capacitance of the variable capacitor 42, respectively. In such arrangement of the VCO 22, the inductance L of the inductor 40 is set at a constant value while the capacitance C of the variable capacitor 42 is made variable. Therefore the variable range of the oscillation frequency F depends on a capacitance varying ratio of the capacitance C. Generally, the variable capacitor 42 used in VCOs oscillating around 1 GHz has a variable range of the capacitance C of about 0.7 pF through 4.0 pF. Thus the capacitance varying ratio of the capacitance C is given by $(4/0.7)^{\frac{1}{2}} \approx 2.4$.

In a practical circuit construction, the oscillation frequency F is influenced by many factors such as stray capacitances accompanied with the circuit construction. Thus the variable range of the frequency F is limited to a relatively smaller range of about 1000 MHz through 2400 MHz with respect to the capacitance varying ratio of 2.4.

This frequency range of 1000 MHz through 2400 MHz is satisfactory for the tuning circuits adapted for receiving only the BS broadcasting signals. However, if the uner is attempted to be able to receive the CS broadcasting signals as well as the BS broadcasting signals, the tuning circuit will be accompanied with some difficulties. This is because the BS and CS broadcasting media serve their broadcasting signals at different frequency bands with each other, as described before. Thus the conventional tuning circuit can receive a limited frequency range but not receive an entire frequency band extending over both frequency ranges of the BS and CS broadcasting signals. Therefore, in the conventional tuning circuit adapted for receiving multi-channel signals it was required a very complicated arrangement. For example, a plurality of inductors were provided for selectively defining different oscillation frequency ranges, or a plurality of VCOs were provided for selectively supplying different oscillation frequency ranges. In the former type the conventional tuning circuit failed to oscillate a stable frequency because of influences due to capacitances accompanied with a switch for selecting the inductors. In the latter type the conventional tuning circuit had a cost problem and a space problem for accomodating many VCOs.

Therefore it is desired to provide a novel tuning circuit which is able to stably receive broadcasting signals over a very broad band channel at a simple construction.

SUMMARY OF THE INVENTION

An object of the present invention is to provide a tuning circuit which is able to stably receive broadcasting signals over a very broad band channel at a simple construction.

This and other objects are achieved in the tuning circuit according an aspect of the present invention, which includes an input circuit for receiving RF signals associated with the BS and CS broadcasting signals, respectively, a splitter for splitting the RF signal to a low RF signal and a high RF signal, an oscillator for generating a local frequency signal, a first mixer for frequency converting the low RF signal to a first IF signal in the up-heterodyne fashion using the local frequency signal, a second mixer for frequency converting the high RF signal to a second IF signal in the down-heterodyne fashion using the local frequency signal, a selector for selecting either the first or the second IF signal and a demodulator for demodulating the information from the selected IF signal.

Additional objects, advantages and features of the present invention will become apparent to persons skilled in the art from a study of the following description and of the accompanying drawings, in which:

BRIEF DESCRIPTION OF THE DRAWINGS

FIG. 1 is a block diagram showing a conventional tuning circuit;

FIG. 2 is a circuit diagram showing an example of the VCO in FIG. 1;

DESCRIPTION OF THE PREFERRED EMBODIMENTS

The present invention will now be described in detail with reference to the accompanying drawings, FIGS. 3 to 5.

Figure 3:
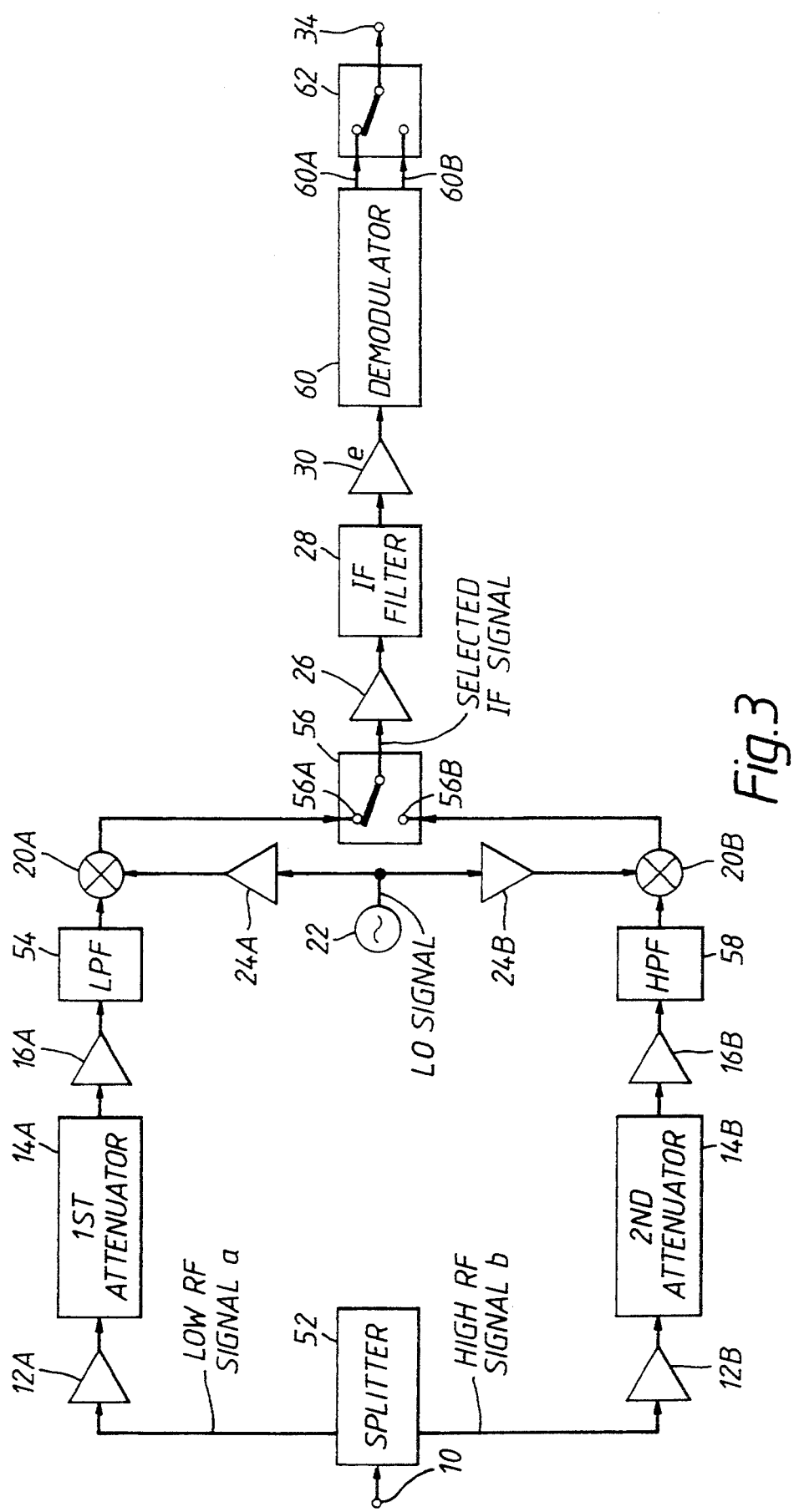
FIG. 3 is a block diagram showing an embodiment of the tuning circuit according to the present invention.
Figure 4:
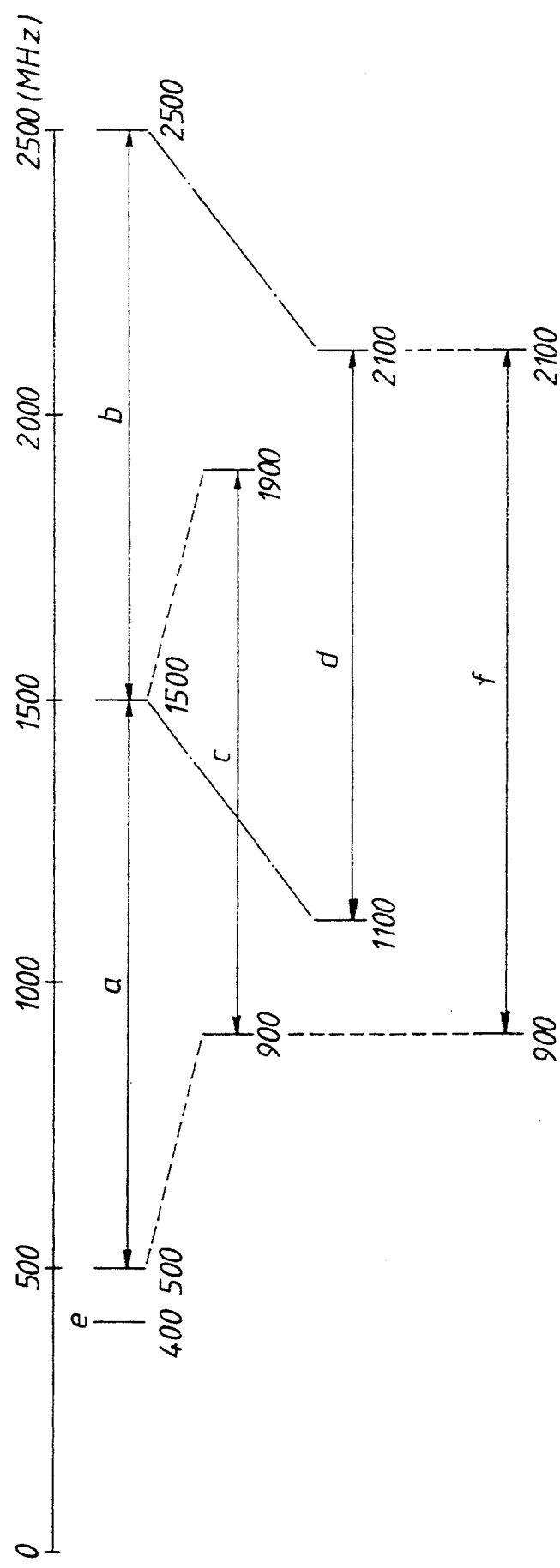
FIG. 4 is a frequency band diagram for illustrating the operation of the tuning circuit of FIG. 3.

Referring now to FIGS. 3 and 4, a first embodiment of The tuning circuit according to the present invention will be described in detail. FIG. 3 is a block diagram showing the first embodiment of the tuning circuit. FIG. 4 is a frequency band diagram for illustrating the operation of the tuning circuit of FIG. 3.

In FIG. 3, an input terminal 10 is provided for receiving RF signals. The RF signals are converted from broadcasting signals, e.g., both a BS broadcasting signal and a CS broadcasting signal which are received by an antennna system (not shown), respectively, so that the BS and the CS broadcasting signals are converted to the RF signal associated to the BS and the CS broadcasting signals by a converter in the antennna system. The RF signals on the input terminal 10 are then applied to a signal splitter 52. The signal splitter 52 splits the RF signals into a lower frequency signal (referred to as low RF signal, hereinafter) a associated to the BS broadcasting signal and a higher frequency signal (referred to as high RF signal, hereinafter) b associated to the CS broadcasting signal. The low RF signal a is routed to a first low RF amplifier 12A, while the high RF signal b is routed to a first high RF amplifier 12B.

In the first low RF amplifier 12A the low RF signal a is amplified to a suitable level. The low RF signal a amplified in the first low RF amplifier 12A is then applied to a first attenuator 14A wherein the low RF signal a is attenuated for reducing noise components. The low RF signal a attenuated in the first attenuator 14A is then applied to a second low RF amplifier 16A wherein the low RF signal a is again amplified to restore the level of the low RF signal a. The low RF signal a amplified in the second low RF amplifier 16A is then applied to an LPF 54. The LPF 54 passes therethrough a first prescribed frequency band of the low RF signal a for removing undesired frequency components above the first prescribed frequency band. The low RF signal a passing through the LPF 54 is then applied to a first mixer 20A. The first mixer 20A receives an LO signal, other than the low RF signal a.

The LO signal is generated by a VCO 22. The LO signal output from the VCO 22 is then applied to the first mixer 16A through a first buffer amplifier 24A. In the first mixer 20A, the low RF signal a is frequency converted to a first IF signal in the up-heterodyne fashion using the LO signal. The first IF signal output from the first mixer 20A is applied to a first input 56A of a first selector 56.

In the first high RF amplifier 12B the high RF signal b is amplified to a suitable level. The high RF signal b amplified in the first high RF amplifier 12B is then applied to a second attenuator 14B wherein the high RF signal b is attenuated for reducing noise components. The high RF signal b attenuated in the second attenuator 14B is then applied into a second high RF amplifier 16B wherein the high RF signal b is again amplified to restore the level of the high RF signal b. The high RF signal b amplified in the second high RF amplifier 16B is then applied to an HPF 58. The HPF 58 passes therethrough a second prescribed frequency band of the high RF signal b for removing undesired frequency components below the second prescribed frequency band. The high RF signal b passing through the HPF 58 is then applied to a second mixer 20B. The second mixer 20B receives the LO signal through a 41B, other than the high RF signal b.

In the second mixer 20B, the high RF signal b is frequency converted to a second IF signal in the down-heterodyne fashion using the LO signal. The second IF signal output from the second mixer 20B is applied to a second input 56B of the first selector 56.

The first selector 56 is operated by a user's choice. Thus the first IF signal on the first input 56A or the second IF signal on the second input 56B is selectively output from the first selector 56 in accordance with the user's choice. The selected IF signal is applied to a first IF amplifier 26 wherein the selected IF signal is amplified to a suitable level. The selected IF signal amplified in the first IF amplifier 26 is then applied to an IF filter 28. The IF filter 28 passes therethrough a prescribed frequency band of the selected IF signal for removing undesired frequency components out of the selected band of the IF signal. The selected band IF signal passing through the IF filter 28 is then applied to a second IF amplifier 30 wherein the selected band IF signal is again amplified to another suitable level. The selected band IF signal amplified in the second IF amplifier 30 is then applied to a demodulator 60. The demodulator 60 demodulates a baseband signal from the selected band IF signal. The baseband signal demodulated by the demodulator 60 differs its polarity in accordance with the manners of the frequency conversion at the first mixer 20A and the second mixer 20B, i.e., the up-heterodyne or the down-heterodyne. The demodulator 60 is typically configured in a balanced circuit fashion for selectively introducing the different polarity baseband signals to its two outputs 60A and 60B. The baseband signals on the outputs 60A and 60B of the demodulator 60 is selectively output to an output terminal 34 of the tuning circuit through a second selector 62.

Referring now to FIG. 4, the operation of the tuning circuit, as shown in FIG. 3, will be described. FIG. 4 shows a frequency band diagram for illustrating the operation of the tuning circuit of FIG. 3. In FIG. 4, consider that the tuning circuit receives the RF signal in a multi-channel transmission band over the frequency range of 500 MHz through 2500 MHz. An RF signal within a lower frequency range of 500 MHz through 1500 MHz, like the low RF signal a, is routed to the first mixer 20A, while another RF signal within a higher frequency range of 1500 MHz through 2500 MHz, like the high RF signal b, is routed to the second mixer 20B. Here it is assumed that the IF frequencies of the first and second IF signals output from the first mixer 20A and the second mixer 20B are the same frequency of 400 MHz (denoted by e in FIG. 4). Then the LO signal applied to the first mixer 20A is required to change in a frequency band of 900 MHz through 1900 MHz (see the range designated by c in FIG. 4), while the LO signal applied to the second mixer 20B is required to change in a frequency band of 1100 MHz through 2100 MHz (see the range designated by d in FIG. 4).

Thus the VCO 22 is required to generate the LO signal at a relatively narrow frequency range of 900 MHz through 2100 MHz (see the range designated by f in FIG. 4). The frequency changing ratio of the IF signal is thus given by [2100/900≅2.33]. This ratio 2.33 is able to satisfy a requirement for not exceeding the limit of the capacitance varying ratio 2.4 of variable capacitors in ordinary VCOs, as shown in FIG. 2. Thus in the first embodiment of the tuning circuit of the present invention, as shown in FIG. 3, the VCO 22 can be easily constructed with a simple fashion like the VCO, as shown in FIG. 2, without being suffered by a cost problem, a space problem and the like.

Figure 5:
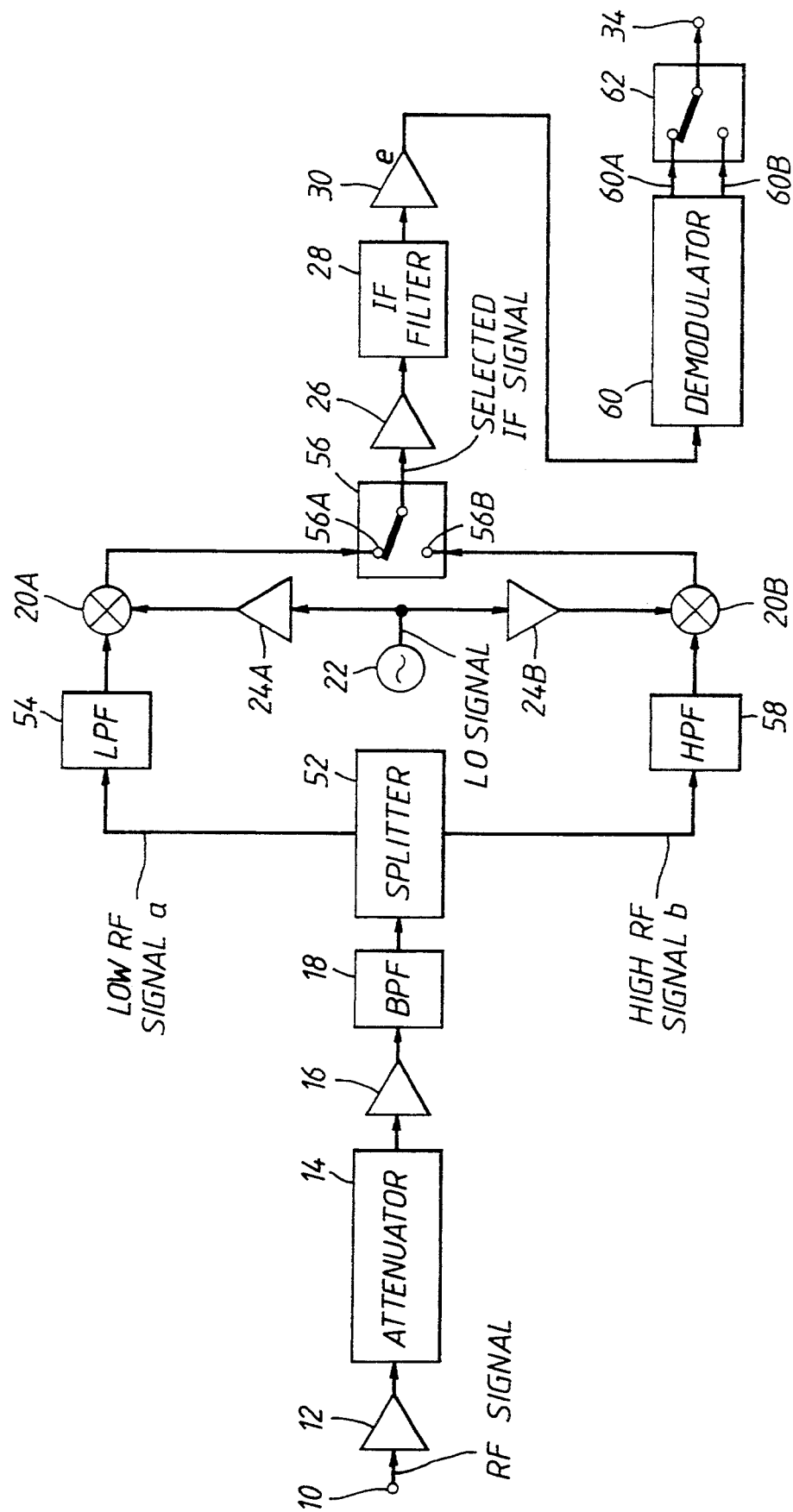
FIG. 5 is a block diagram showing another embodiment of the tuning circuit according to the present invention.

Referring now to FIG. 5, a second embodiment of the tuning circuit according to the present invention will be described. FIG. 5 is a block diagram showing the second embodiment of the tuning circuit.

As shown in FIG. 5, the second embodiment of the tuning circuit is different from the first embodiment in that the RF signal received on the input terminal 10 is commonly routed up to the LPF 54 and the HPF 58, while the signal splitter 52 is inserted after the second RF amplifier 16 for splitting the RF signal to route the low RF signal a and the high RF signal to the 15a and the HPF 58, respectively.

According to the above difference, both the low and high RF signals associated with the BS and CS broadcasting signals on the input terminal 10 are applied to a first RF amplifier 12 wherein the RF signals are amplified to a suitable level. The RF signals amplified in the first RF amplifier 12 are then applied to an attenuator 14 wherein the RF signals are attenuated for reducing noise components. The RF signals attenuated in the attenuator 14 are then applied into a second RF amplifier 16 wherein the RF signals are again amplified to restore the levels of the RF signals. The RF signals amplified in the second RF amplifier 16 are then applied to the signal splitter 52. The signal splitter 52 splits the RF signal into the low RF signal a associated to the BS broadcasting signal and the high RF signal b associated to the CS broadcasting signal. The low RF signal a is routed to the first low RF amplifier 12A, while the high RF signal b is routed to the first high RF amplifier 12B.

Rests of the circuit portion of the tuning circuit according to the second embodiment are identical with the corresponding circuit portion of the tuning circuit according to the first embodiment, so that the descriptions concerning the portion of the second embodiment will be omitted herefrom.

As described above, the present invention can provide an extremely preferable broadband tuning circuit.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A broadband tuner for receiving information comprising:
   means for receiving an input signal, which carries the information, the input signal being within a predetermined frequency range;
   means for splitting the input signal into a lower frequency band signal and a higher frequency band signal;
   means for selecting one of a plurality of tuning frequencies;
   a variable local oscillator for generating a local oscillator signal, a frequency of the local oscillator signal being determined in response to the selected one of the tuning frequencies;
   first means for frequency converting the lower frequency band signal by heterodyning the lower frequency band signal with the local oscillator signal, thereby producing a first intermediate frequency signal having a reception frequency;
   second means for frequency converting the higher frequency band signal by heterodyning the higher frequency band signal with the local oscillator signal, thereby producing a second intermediate frequency signal having the reception frequency;

means for selecting one of the first and the second intermediate frequency signals; and means for demodulating the information from the selected one of the first and the second intermediate frequency signals.

2. A broadband tuner as claimed in claim 1, further comprising a low pass filter means for passing therethrough a first prescribed frequency band of the lower frequency band signal to remove undesired frequency components above the first prescribed frequency band, and a high pass filter means for passing therethrough a second prescribed frequency band of the higher frequency band signal to remove undesired frequency components below the second prescribed frequency band.

3. A broadband tuner as claimed in claim 1, further comprising a band pass filter means for passing therethrough a prescribed frequency band of the input signal to remove undesired frequency components out of the prescribed frequency band.

4. A broadband tuner as claimed in claim 1, wherein the demodulating means includes a demodulator with two balanced outputs.

* * * * *